United States Patent
Zhao

(10) Patent No.: US 7,295,029 B2
(45) Date of Patent: Nov. 13, 2007

(54) CHIP-SCALE PACKAGE FOR INTEGRATED CIRCUITS

(75) Inventor: Yang Zhao, Andover, MA (US)

(73) Assignee: Memsic, Inc., North Andover, MA (US)

( * ) Notice: Subject to any disclaimer, the term of this patent is extended or adjusted under 35 U.S.C. 154(b) by 101 days.

(21) Appl. No.: 11/242,296

(22) Filed: Oct. 3, 2005

(65) Prior Publication Data

US 2006/0216857 A1 Sep. 28, 2006

Related U.S. Application Data

(63) Continuation-in-part of application No. 11/088,633, filed on Mar. 24, 2005, now Pat. No. 7,262,622.

(51) Int. Cl.
*G01R 31/02* (2006.01)
*G01R 31/26* (2006.01)

(52) U.S. Cl. ........................... 324/763; 324/765

(58) Field of Classification Search ............ None
See application file for complete search history.

(56) References Cited

U.S. PATENT DOCUMENTS 6,291,884 B1 * 9/2001 Glenn et al. .............. 257/747
6,656,827 B1 * 12/2003 Tsao et al. ................ 438/612
6,882,045 B2 * 4/2005 Massingill et al. ........ 257/724
6,900,532 B1 * 5/2005 Kelkar et al. ............. 257/698
7,115,997 B2 * 10/2006 Narayan et al. ........... 257/769

OTHER PUBLICATIONS

Cluff et al., 10A.1 Electronic Packaging Technologies, CRC Press LLC (2001).

* cited by examiner

Primary Examiner—Jermele Hollington
(74) Attorney, Agent, or Firm—Weingarten, Schurgin, Gagnebin & Lebovici LLP

(57) ABSTRACT

A chip-scale packaged IC is made by bonding one or more singulated die chips (from an IC wafer) to a common substrate, such as a single cap wafer (or a portion thereof) and cutting (singulating) the substrate to yield individual, chip-scale packaged ICs. Alternatively, each die chip is bonded to an individual, pre-cut cap. Electrically conductive paths extend through the cap wafer, between wafer contact pads on the surface of the cap and electrical contact points on the IC wafer. Optionally, the cap wafer contains one or more die. The IC wafer can be fabricated according to a different technology than the cap wafer, thereby forming a hybrid chip-scale packaged IC. Optionally, additional "upper-level" cap wafers (with or without die) can be stacked to form a "multi-story" IC.

46 Claims, 18 Drawing Sheets

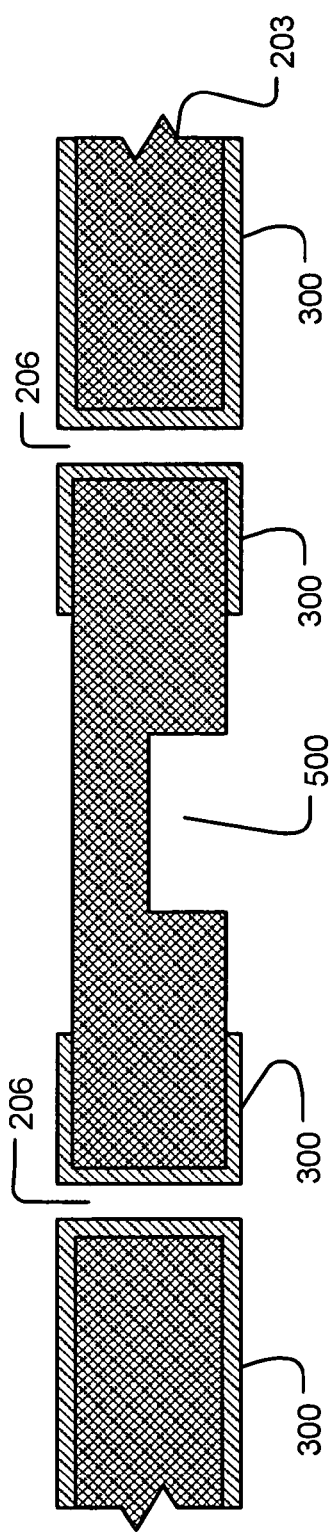
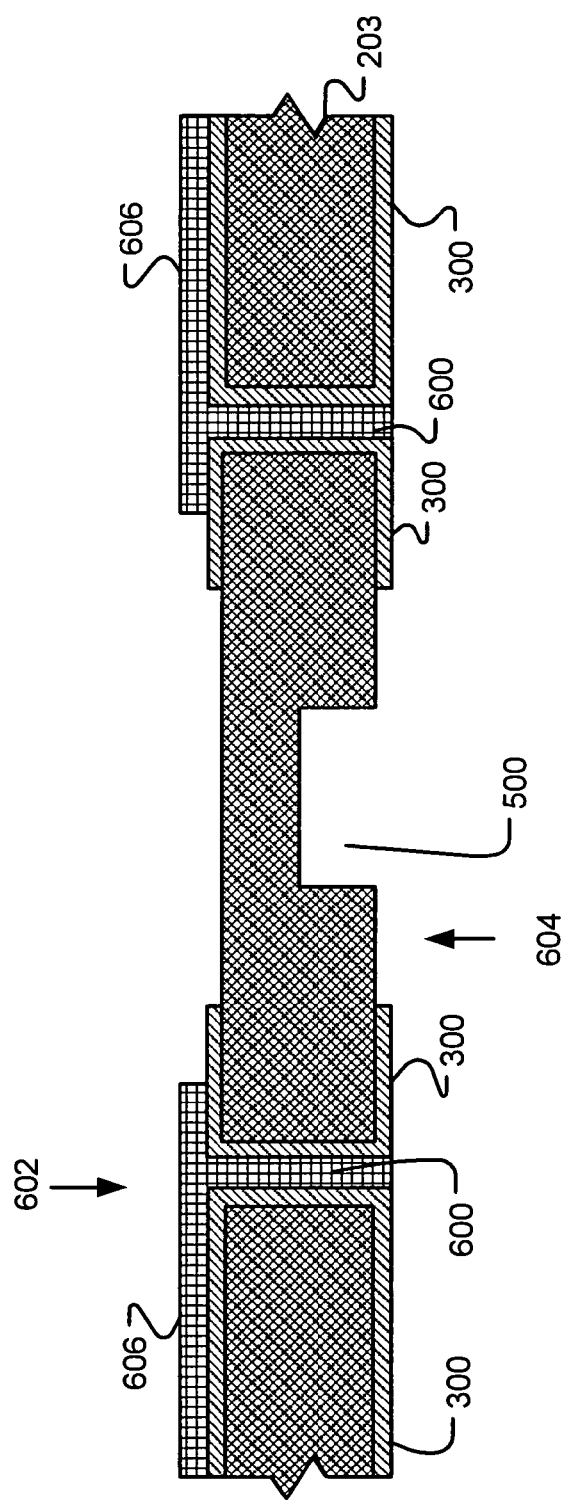

CHIP-SCALE PACKAGE FOR INTEGRATED CIRCUITS

CROSS REFERENCE TO RELATED APPLICATIONS

This application is a continuation-in-part of U.S. patent application Ser. No. 11/088,633, filed Mar. 24, 2005 now U.S. Pat. No. 7,262,622, titled "Wafer-Level Package for Integrated Circuits."

STATEMENT REGARDING FEDERALLY SPONSORED RESEARCH OR DEVELOPMENT (Not applicable)

BACKGROUND OF THE INVENTION

The present invention relates to integrated circuit packages and, more particularly, to wafer-level packages for integrated circuits. Integrated circuits (ICs) are manufactured as wafers, each wafer containing many individual circuits (die). After fabrication, a wafer is cut ("singulated") into individual die. Each die is then encapsulated in a plastic or ceramic package or is attached to a ceramic cap.

Each die includes several electrical contact pads. During packaging, each of these contact pads is connected to a respective lead or another external structure. In one common practice, a bonding wire is welded between each contact pad and a respective lead. The leads or other structures are used to electrically connect a completed IC to a circuit board or the like, such as by soldering. These solder connections often also provide the sole mechanical connection between the IC and the circuit board.

IC wafer fabrication is commonly referred to as the "front-end" process of IC fabrication. An IC wafer can be fabricated relatively efficiently, because all die on the wafer are fabricated concurrently (i.e., in parallel), such as by a photolithographic process, in which an entire layer of the wafer is produced at one time using a lithographic mask. Thus, the amount of time required to fabricate a wafer is largely independent of the number of die on the wafer. However, after the die are singulated, packaging the individual die (the "back-end" process of IC fabrication) is time consuming and expensive, because each die must be packaged individually (i.e., serially). Given the reliance of the electronics industry on ICs and the large number of ICs installed every week, reducing the cost of each IC can lead to a substantial overall cost saving.

BRIEF SUMMARY OF THE INVENTION

The present invention provides a method of wafer-level packaging (WLP) integrated circuits (ICs). Embodiments of the invention include the resulting wafer-level packed ICs and chip-scale packaged (CSP) ICs. The invention also provides methods for fabricating wafer-level packaged hybrid ICs and their components modules, and embodiments of the invention include such hybrid ICs and their components. The invention eliminates the traditional back-end process and extends traditional multi-chip hybrid packaging to wafer-level and to chip-scale modules, which provide integration through chip bonding.

A wafer-level packaged IC is made by attaching a cap wafer to an IC wafer before cutting the IC wafer, i.e. before singulating the plurality of die on the IC wafer. The cap wafer is overlaid over some or all of the die on the IC wafer, then the cap wafer is mechanically attached and electrically connected to the IC wafer. The cap wafer can comprise plain (i.e., without any IC circuitry) silicon or other material, or the cap wafer can contain IC circuitry, which can be electrically connected to the die on the IC wafer. Advantageously, the IC wafer can be fabricated according to a different technology than the cap wafer, thereby forming a hybrid wafer-level package. After the cap wafer is mechanically attached and electrically connected to the IC wafer, the cap wafer and the IC wafer are cut, yielding singulated, packaged ICs that can be soldered or otherwise mounted to circuit boards. Alternatively, the cap wafer is cut without cutting the IC wafer, to facilitate attaching an additional ("upper-story") one or more caps (with or without die) to form a "multi-story" IC.

Thus, all the die on the IC wafer can be packaged in a single operation, and then the packaged die are singulated, significantly reducing the time and cost to package the die. These and other features, advantages, aspects and embodiments of the present invention will become more apparent to those skilled in the art from the Detailed Description of the Invention that follows.

BRIEF DESCRIPTION OF THE SEVERAL VIEWS OF THE DRAWINGS

The invention will be more fully understood by referring to the Detailed Description of the Invention in conjunction with the Drawings, of which:

FIGS. 2-8 are cross-sectional diagrams of a wafer-level packaged IC at various intermediate stages during fabrication, in accordance with one embodiment of the present invention;

DETAILED DESCRIPTION OF THE INVENTION

Figure 1A:
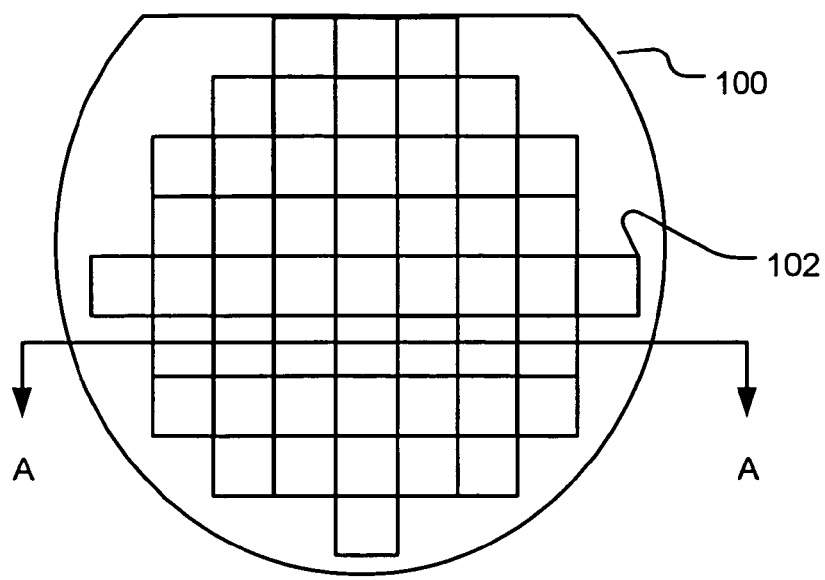
FIG. 1a is a top view diagram of an integrated circuit (IC) wafer, in accordance with one embodiment of the present invention.

Embodiments of the present invention include wafer-level packages for integrated circuits (ICs), as well as methods for fabricating wafer-level packaged ICs and their components. A wafer-level packaged IC is made by attaching a semiconductor cap wafer to an IC wafer before cutting the IC wafer, i.e. before singulating the plurality of die on the IC wafer. The cap wafer is overlaid over some or all of the die on the IC wafer, then the cap wafer is mechanically attached to the IC wafer. For example, the wafers can be attached to each other by solder at various counterfacing locations on the cap wafer and on the IC wafer in the vicinity of each die. Each die is sealed between the cap wafer and the IC wafer, such as to prevent infiltration of moisture. The seal can be provided by the mechanical attachment between the cap wafer and the IC wafer, or the seal and the mechanical attachment can be provided by separate elements.

The IC wafer contains at least one electrical contact point proximate to, and associated with, each die. For example, according to conventional IC packaging practices, bonding wires might be welded to these contact points. On the side of the cap wafer away from the die (the "front side" of the cap wafer), the cap wafer contains electrical contact pads corresponding to at least some of the die electrical contact points. Electrically conductive material extends from these cap wafer contact pads, through the cap wafer, and is electrically connected on the other side of the cap wafer (the "back side" of the cap wafer) to respective electrical contact points on the IC wafer. Preferably, the electrical connections between the cap wafer and the IC wafer also provide the mechanical attachment of the cap wafer to the IC wafer, although the electrical connections and the mechanical attachments can be provided by separate elements.

Optionally, the cap wafer contains one or more die, which can be electrically connected to the die on the IC wafer, such as by some of the contact pad extensions. Advantageously, the IC wafer can be fabricated according to a different technology than the cap wafer, thereby forming a hybrid wafer-level package. For example, one wafer can be fabricated using silicon (Si), gallium arsenide (GaAs), gallium nitride (GaN) or any other suitable material, and the other wafer can be fabricated using another of these or other materials.

After the cap wafer is mechanically attached and electrically connected to the IC wafer, the cap wafer and the IC wafer are cut, yielding singulated, packaged ICs that can be soldered or otherwise mounted to circuit boards. Alternatively, the cap wafer is cut without cutting the IC wafer, to facilitate attaching an additional ("upper-story") one or more caps (with or without die) to form a "multi-story" IC. In this case, the IC wafer is cut at the same time as or after the top level cap is cut. Each layer of such a multi-story IC can be fabricated according to a different technology. Optionally, several die on a single IC wafer are covered by a single cap wafer to form a horizontal group of die under a single cap.

Figure 7:
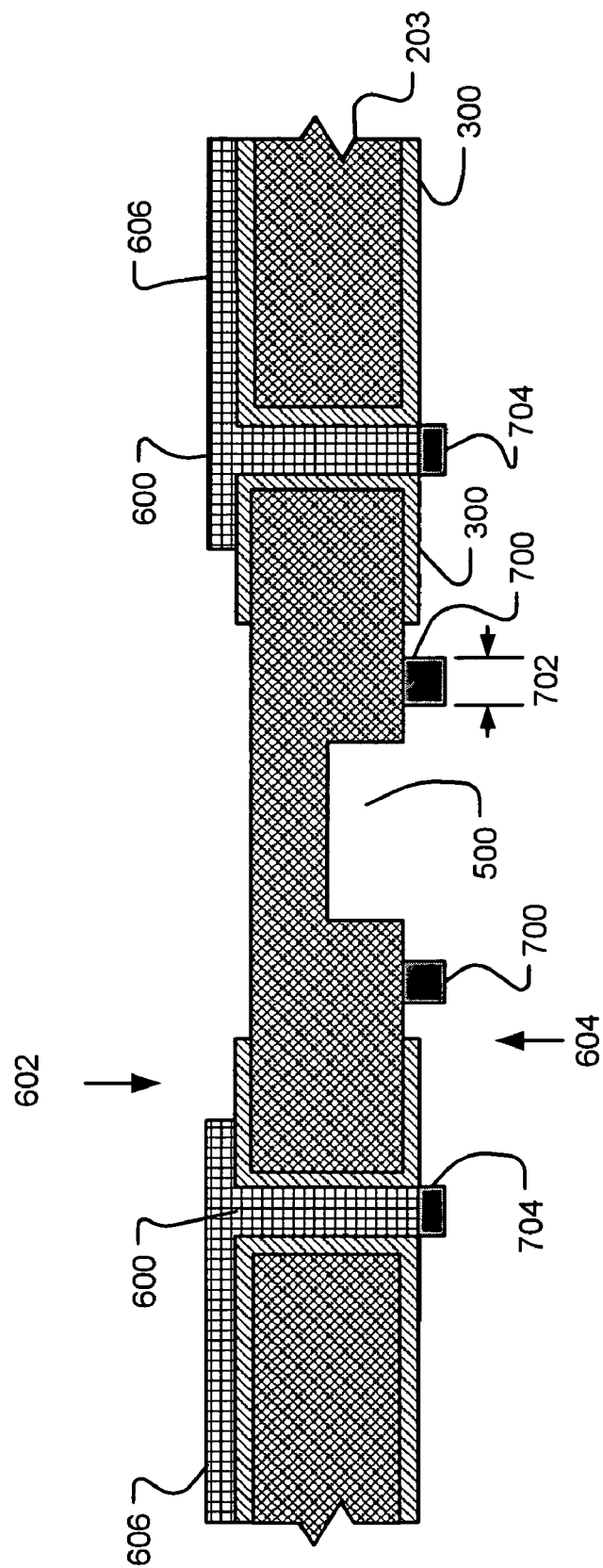
Figure 8:
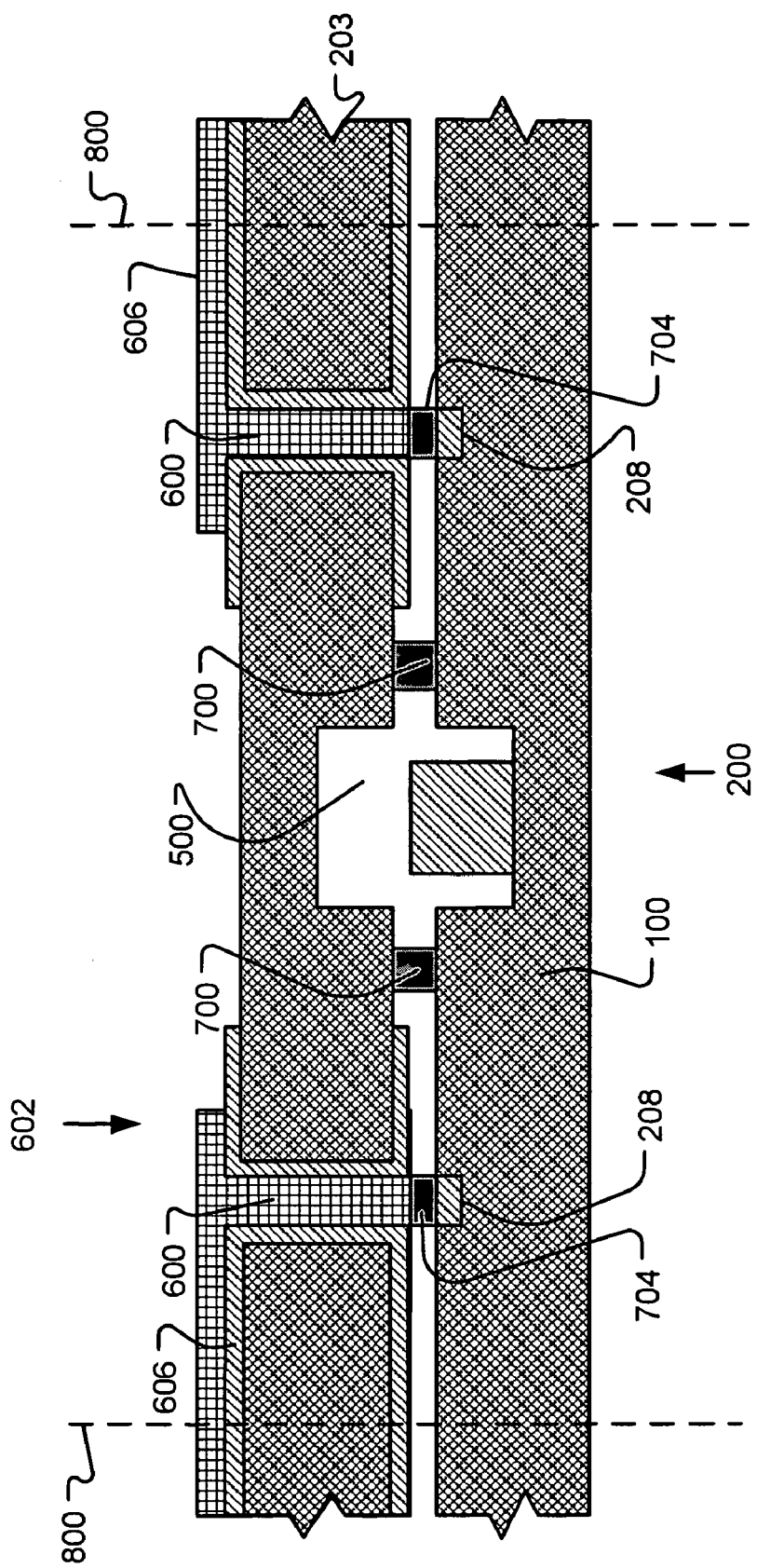
Figure 9:
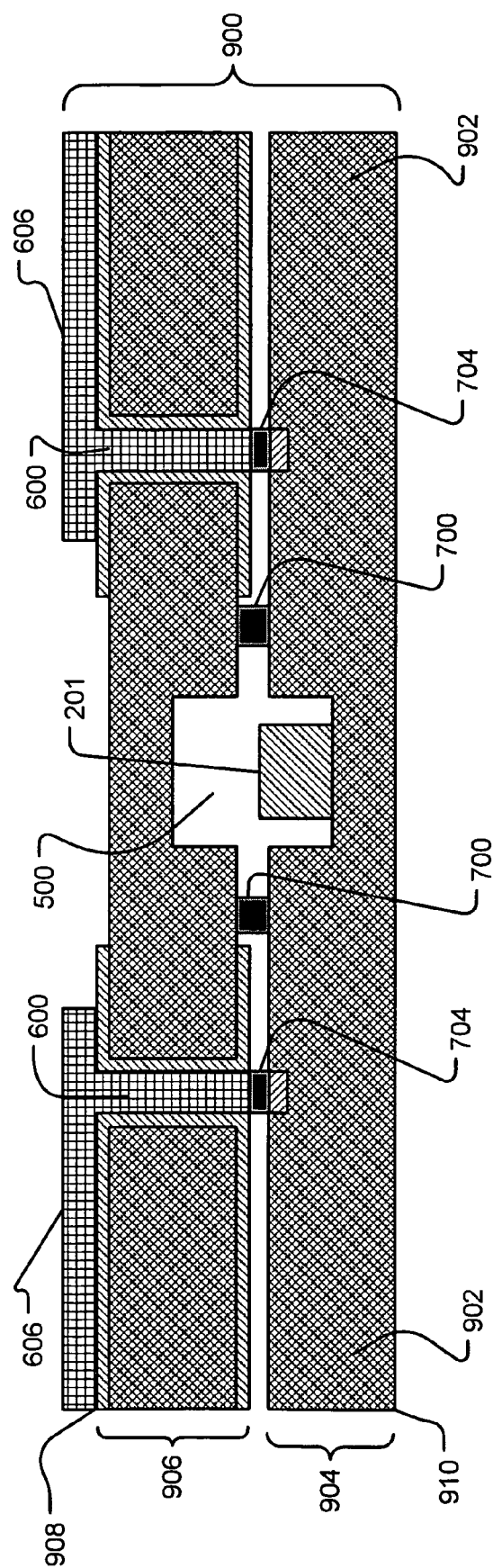
FIG. 9 is a cross-sectional diagram of a completed wafer-level packaged IC, in accordance with one embodiment of the present invention.
Figure 10:
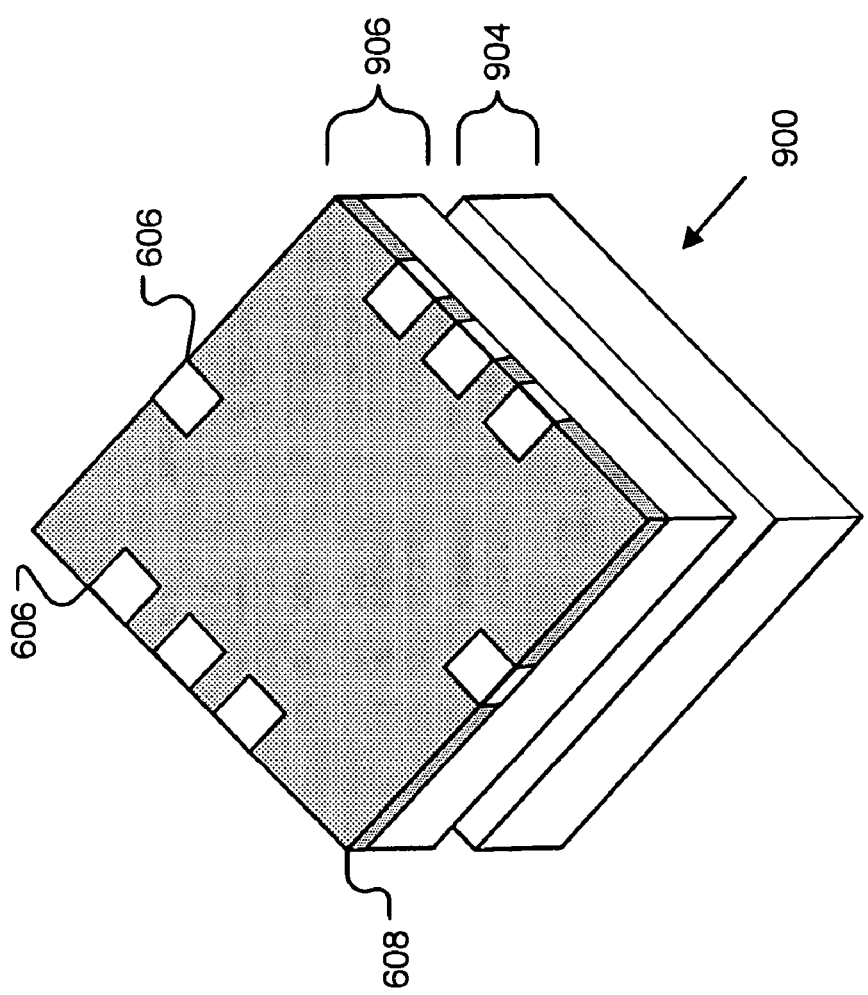
FIG. 10 is an isometric view of a packaged IC, in accordance with one or more embodiments of the present invention.

FIGS. 2-8 illustrate intermediate stages during fabrication of a wafer-level packaged IC, according to one embodiment of the present invention. FIGS. 9 and 10 illustrate a completed wafer-level packaged IC that may be a product of the stages shown in FIGS. 2-8.

FIG. 1a is a top view of an IC wafer 100 containing a plurality of die, such as die 102. Die 102 can contain a digital or analog electronic component or circuit (such as a light-emitting diode (LED), photo-sensor, microprocessor, memory, amplifier, filter or transmitter), a micro-machined or micro-electromechanical (MEMS) structure (such as a cantilevered accelerometer) or any other type or combination of IC elements. All die on the IC wafer 100 can be identical, or the IC wafer 100 can contain a mixture of die. The IC wafer 100 can be fabricated using any acceptable material, such as Si, GaAs or GaN.

Figure 1B:
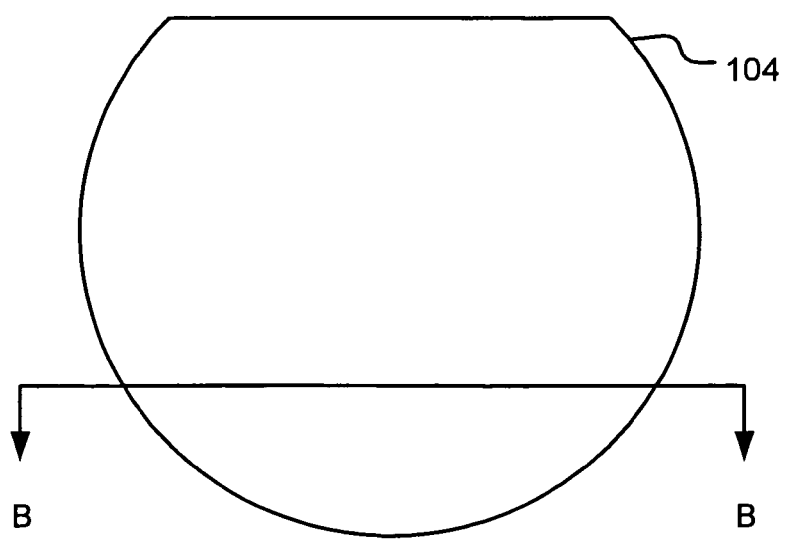
FIG. 1b is a top view diagram of a cap wafer, in accordance with one embodiment of the present invention.
Figure 2:
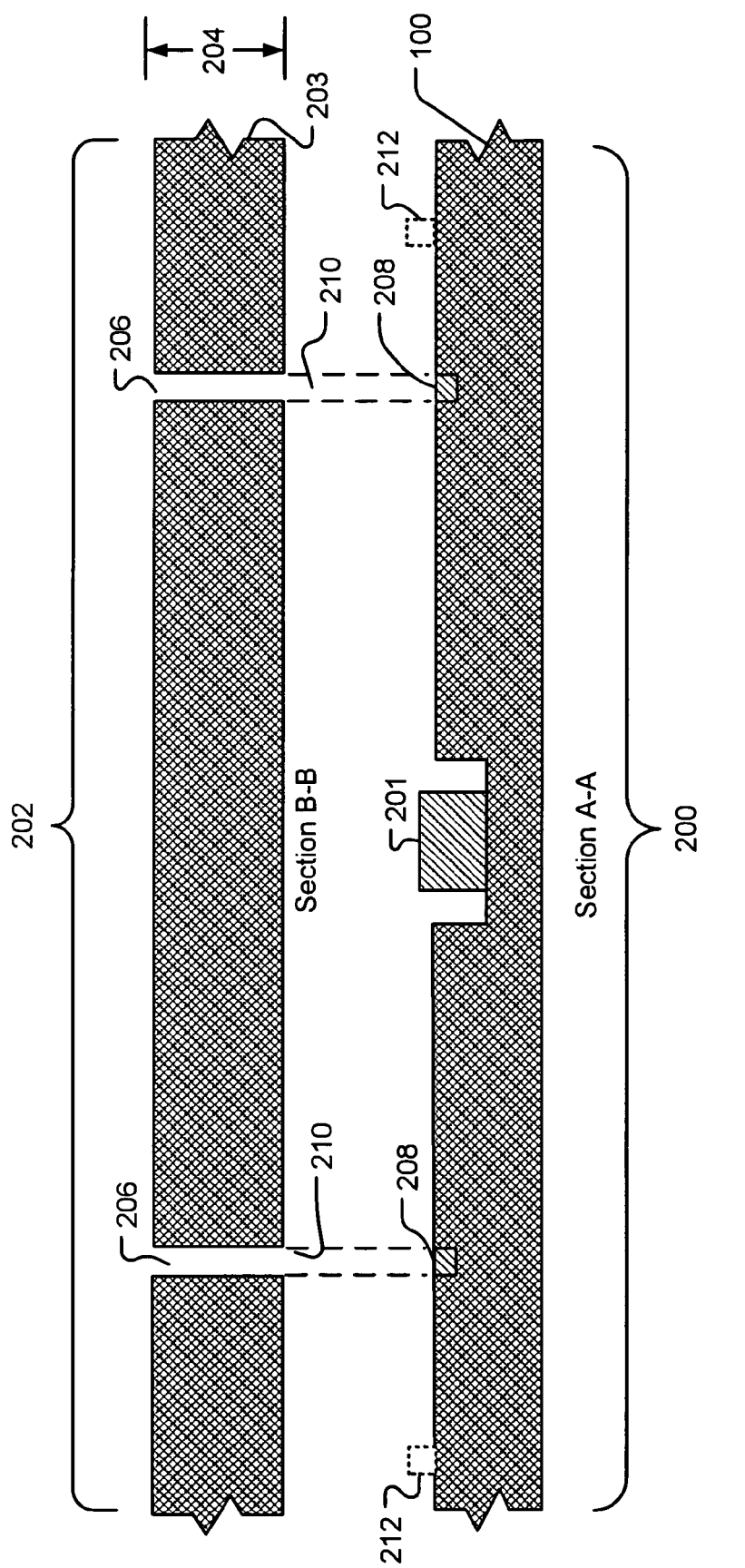

FIG. 2 illustrates a portion 200 of a cross-section through section A-A of the IC wafer 100 of FIG. 1. The portion 200 includes a single exemplary die 201 and some of the IC wafer 100 on each side of the die. The exemplary die 201 shown in FIG. 2 includes a MEMS sensor that has been fabricated on the IC wafer 100 and that is to be enclosed by a wafer-scale package. However, instead of the MEMS sensor die 201, the IC wafer 100 can contain other types of IC die. Furthermore, rather than a single die 201, the portion 200 can include a plurality of die (not shown).

FIG. 1b is a top view of a cap wafer 104. The cap wafer 104 is preferably fabricated from silicon (Si), but other suitable materials, such as GaAs or GaN are acceptable. Ceramic materials can also be used, as discussed in more detail below. The cap wafer 104 and the IC wafer 100 preferably have similar coefficients of thermal expansion (CTE). If the CTEs are significantly mismatched, it may be necessary to attach small caps (such as singulated portions of the cap wafer 104) to respective portions of the IC wafer 100. Alternatively, the IC wafer 100 can be singulated, and individual die 102 or groups of die can be attached to the cap wafer 104. Another embodiment, which involves chip-scale packaging, is described below.

FIG. 2 also illustrates a portion 202 of a cross-section through section B-B of the silicon cap wafer 104 positioned above the IC wafer 100. The cap wafer 104 is shown above the IC wafer 100 in FIG. 2 to facilitate describing structures formed on the cap wafer and their relationships to features on the IC wafer, although the cap wafer is typically not suspended above the IC wafer during fabrication. The cap wafer 104 (and, in some embodiments, the IC wafer 100) includes novel features as described herein, however, the wafer(s) and these features can be fabricated and processed using well-known techniques.

The cap wafer 104 is typically approximately the same size and shape as the IC wafer 100, although the cap wafer can have a larger or smaller diameter or a different shape than the IC wafer. After fabrication, to reduce the height of the resulting package, the cap wafer 104 is preferably thinned, such as by lapping, prior to subsequent processing. Any thickness cap wafer is acceptable, as long as the cap wafer 104 and the ultimate resulting cap and package are structurally sound. The thickness 204 of the cap wafer 104 depends, in part, on the size, material, configuration, etc. of the cap wafer 104 and the ultimate resulting cap. In one embodiment, the cap wafer 104 is thinned to about 200 microns or thinner, although cap wafers thicker than 200 microns are acceptable.

Holes, such as holes 206, are formed through the cap wafer 104 in locations that correspond to wire bonding pads, electrical contact pads or the like 208 (collectively herein referred to as "contact points") on the IC wafer 100. These contact points 208 are typically associated with the sensor die 201 and are electrically connected to the die via circuitry (not shown) in various layers of the IC wafer 100. The relationships between the holes 206 in the cap wafer 104 and the contact points 208 on the IC wafer 100 are indicated by dashed lines 210. The holes 206 can be formed (referred to herein as "drilled") by any acceptable method, such as deep etching or laser drilling.

Figure 3:
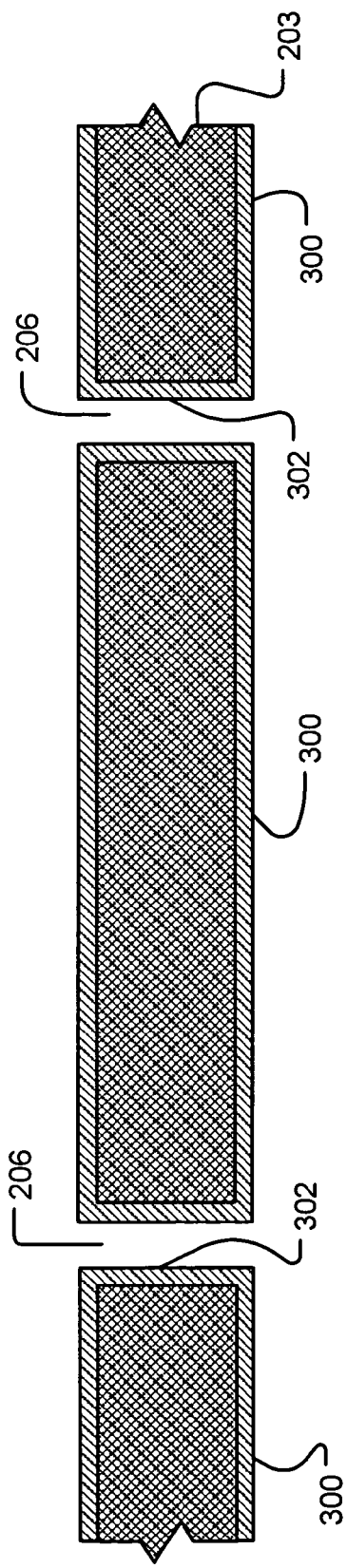

As shown in FIG. 3, an electrical insulating layer 300 is grown or deposited (herein collectively referred to as "formed") on the surface of the cap wafer 104, including on the inside walls 302 of the holes 206. The composition of the insulating layer 300 is any suitable material, such as silicon dioxide ($SiO_2$) or silicon nitride (SiN), that is compatible with the cap wafer 104. The insulating layer 300 can be grown (for example as a thermally grown oxide), deposited (such as by vapor deposition) or formed by any other acceptable method.

Figure 4:
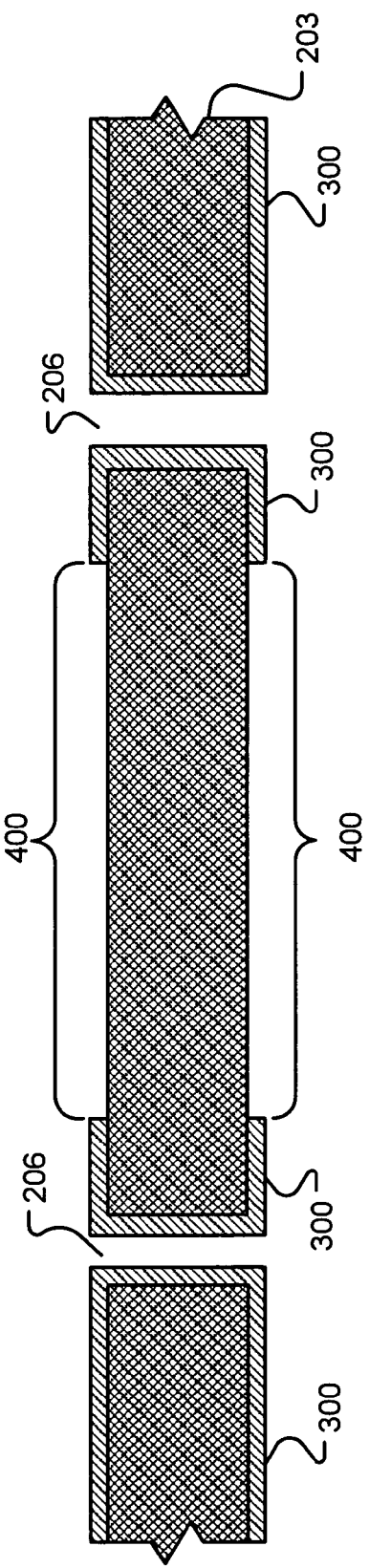

As shown in FIG. 4, portions 400 of the insulating layer 300 are removed, such as by dry or wet etching. Optionally, as shown in FIG. 5, a cavity 500 is formed in the cap wafer 104 to provide space for the sensor die 201 (FIG. 2) once the cap wafer is attached to the IC wafer 100. Optionally, all or a portion of the cavity 500 can be lined with a conductive material (not shown) to provide electromagnetic interference (EMI) shielding for the sensor die 201 or other device. Alternatively, a metal layer can be included between two layers of silicon, ceramic or other material(s) to form the EMI shield. Similarly, a portion of the IC wafer 100 proximate the sensor die 201 or other device can include EMI shielding.

As shown in FIG. 6, the holes 206 are filled with an electrically conductive material 600. This electrically conductive material 600 extends from the front side 602 of the cap wafer 104 to the back side 604 of the cap wafer to create electrically conductive paths ("through-hole interconnects") through the cap wafer. The electrically conductive material 600 can be any suitable material, such as a gold alloy (for example gold-tin (AuSn)), another solder, a metal powder mixed with an organic solvent that is subsequently driven off ("burned away") by heat (collectively referred to herein as a "powdered metal alloy paste"), or the like. The metal can be electroplated, for example, onto the cap wafer 104. The electrically conductive material 600 preferably fills the holes 206, such that the conductive material 600 is flush with the insulating layer 300 on the back side 604 of the cap wafer 104. In addition, the electrically conductive material 600 preferably overlays a portion of the insulating layer 300 on the front side 602 of the cap wafer 104 adjacent each hole 206 to form respective wafer contact pads 606.

Optionally (not shown), some of the holes 206 are only partially filled with electrically conductive material 600 to create electrically conductive paths that extend through only a portion of the thickness of the cap wafer 104. The remainder of these holes 206 is filled with an insulative material. Such conductive paths can electrically connect circuits in the IC wafer 100 with circuits in the cap wafer 104, without reaching the front side 606 of the cap wafer 104. Alternatively, such conductive paths can electrically connect circuits in the cap wafer 104 with wafer contact pads 606, without necessarily reaching the back side 604 of the cap wafer 104.

As shown in FIG. 7, a seal ring 700 is formed, such as by printing, on the cap wafer 104 around each cavity 500. If necessary, depending on the composition of the seal ring 700, the cap wafer 104 and/or the IC wafer 100 are heated to soften, melt or activate the seal ring when the cap wafer is attached to the IC wafer. When the cap wafer 104 is attached to the IC wafer 100, as shown in FIG. 8, the seal ring 700 surrounds and seals the sensor die 201, such as against infiltration of gas or moisture between the cap and the IC wafer or to otherwise protect the sensor die. The seal ring 700 can be circular, as viewed from the top (not shown), or another shape. The seal ring 700 can surround all or a portion of the contact pads, i.e. it can follow any convenient path along the wafer. The seal ring 700 can be hermetic or non-hermetic, depending on the materials used. The seal ring 700 is made of any suitable material, such as glass, metal or metal alloy (for example gold-aluminum (AuAl), AuSn or other solder, indium-gold-tin, copper on aluminum or nickel on aluminum), and of sufficient width 702 and thickness (FIG. 7) to provide a uniform seal that complies with the topography (such as IC circuitry) on the wafer surface. Alternatively, the seal ring 700 is made of an epoxy, a suitable polymer or other material.

Generally, the speed of infiltration through the seal ring 700 depends on the material and width of the seal ring. In one embodiment, a glass seal ring 700 having a width 702 of about 100 microns provides a hermetic seal. Other widths 702 that are greater than or less than 100 microns are also acceptable. For example, a glass seal ring 700 having a width 702 of about 250 microns experiences a lower rate of infiltration than a similar seal ring having a width of about 100 microns. The amount of glass should, however, be limited, if there is a significant difference in the CTEs of the glass and of the cap or IC wafers 104 and 100. If a non-hermetic seal around the die 201 is acceptable, other materials, such as organic epoxies, can be used instead of glass or metal for the seal ring 700.

Also as shown in FIG. 7, bumps or dots 704 of solder or other suitable material (such as a conductive polymer or conductive epoxy) are placed on the back side 604 ends of the electrically conductive material 600. When the cap wafer 104 is attached to the IC wafer 100, as shown in FIG. 8, the cap wafer and/or the IC wafer are heated (if necessary, depending on the material of the bumps or dots 704) to soften or melt the bumps or dots, and the solder or other material attaches to, and makes electrical contact with, the contact points 208 on the IC wafer 200. Thus, the sensor die 201 is electrically connected to the wafer contact pads 606 and, optionally, to a die (not shown) on the cap wafer 104. After the die 201 is singulated from the IC wafer 100, the resulting IC can be mechanically attached and electrically connected to a circuit board, such as by soldering the wafer contact pads 606 to the circuit board.

The electrical connections provided by the solder bumps or dots 704 preferably also mechanically bind the cap wafer 104 to the IC wafer 100. The seal ring 700 preferably also mechanically binds the cap wafer 104 to the IC wafer 100. Optionally, instead of or in addition to the solder bumps or dots 704 and the seal ring 700, additional solder bumps or dots, glass frits, organic epoxies or other materials (not shown) are used to mechanically bind the cap wafer 104 to the IC wafer 100. Optionally, after the cap wafer 104 is attached to the IC wafer 100, the IC wafer 100 is thinned, such as by lapping, to reduce the overall thickness of the resulting IC.

The structure formed by attaching the cap wafer 104 to the IC wafer 100 (a portion of which is shown in cross-section in FIG. 8) is referred to herein as a composite wafer. As discussed in more detail below, a composite wafer can include more than two wafers in a "multi-story" structure.

As shown in FIG. 8, after the cap wafer 104 is attached to the IC wafer 100, the cap wafer and the IC wafer are cut, such as by a die saw, along dashed lines 800 between pairs of die on the IC wafer to singulate the sensor die 201 from the IC wafer 100. The resulting IC 900 is shown in cross-section in FIG. 9 and in an isometric view in FIG. 10. The IC 900 includes a base portion 904 and a cap 906. As noted, the IC 900 can then be electrically and mechanically attached to a circuit board by soldering the wafer contact pads 606 to the circuit board. Advantageously, the die 201 is electrically connected to the wafer contact pads 606 by the electrically conductive material 600, without the use of wire bonding or die bonding.

The cavity 500 provides a sealed environment for the die 201. The cap wafer 104 can be attached to the IC wafer 100 in the presence of an inert gas, dried air, another gas, a vacuum or another substance, which is then trapped within the cavity 500. Optionally, when the cap wafer 104 is attached to the IC wafer 100, some or all of the space between the cap wafer and the IC wafer is filled within organic glue or another filler.

Although the sensor die 201 is shown to be closer to the seal ring 700 than to the solder bumps or dots 704, the respective positions of the seal ring and the solder bumps or dots can be exchanged (not shown). That is, the seal ring 700 can be located outside the solder bumps or dots 704 (relative to the sensor die 201), such as near the edges 902 of the IC 900. If the cap wafer 104 and the IC wafer 100 are metalized (not shown) in portions 908 and 910 (respectively) that will become the edges, or regions near the edges, of the completed IC 900 after the cap wafer 104 and/or the IC wafer 100 is singulated, these portions 908 and 910 can be soldered together to form a mechanical connection and/or a seal along the periphery of the IC.

As noted, the cap wafer 104 and the IC wafer 100 can be fabricated according to different technologies, yielding a hybrid IC 900. For example, one embodiment of a hybrid satellite receiver IC is made from an IC wafer 100 that contains a preamplifier fabricated with gallium arsenide (GaAs) and from a cap wafer 104 that contains later-stage amplifiers fabricated with silicon (Si). The preamplifier and the later-stage amplifiers are interconnected by the solder bumps or dots 704 between the cap wafer 104 and the IC wafer 100.

When the cap wafer 104 and the IC wafer 100 are assembled, the solder bumps or dots 704 and (if necessary) the seal ring 700 are heated to soften, melt or activate the solder, glass, epoxy and/or other materials between the cap wafer and the IC wafer, and the cap wafer and the IC wafer are pressed together. Care should be exercised to maintain an appropriate gap between the cap wafer 104 and the IC wafer 100 while the solder, etc. harden. If the gap is too wide, the solder, etc. does not bond to the IC wafer 100. On the other hand, if the cap wafer 104 and the IC wafer 100 are pressed too closely together, the solder, etc. can be squeezed between the wafers and spread, such as beyond the boundaries of the contact points 208.

Spacers between the cap wafer 104 and the IC wafer 100 can be used to maintain an appropriate gap while the solder, etc. harden. In one embodiment, discrete spacers (i.e. spacers that are not part of the cap wafer or of the IC wafer) are inserted between the cap wafer 104 and the IC wafer 100 when the cap wafer and the IC wafer are assembled. After the solder, etc. harden, the spacers are removed. Alternatively, the spacers can remain in place.

Figure 11:
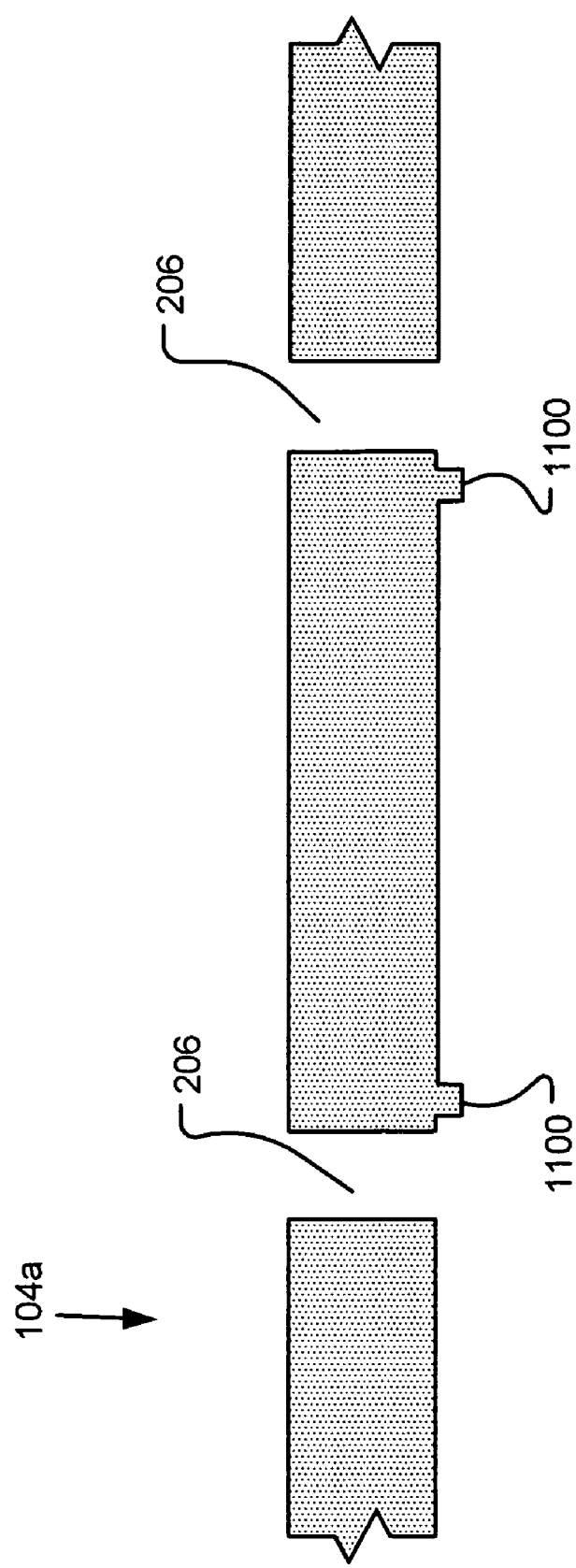
FIG. 11 is a cross-sectional diagram of a cap wafer for a wafer-level packaged IC, in accordance with another embodiment of the present invention.

In accordance with another embodiment of the present invention, rather than using discrete spacers, an alternative cap wafer 104a is fabricated with integrated spacers 1100 that are proud of other nearby features on the cap wafer, as shown in FIG. 11. The spacers 1100 are preferably formed before an insulating layer (not shown) is formed on the cap wafer 104a. The spacers 1100 are fabricated by any appropriate method, such as micro-machining, i.e. using an additional lithographic mask. (Such spacers and any insulating layers, etc. thereon are collectively hereinafter referred to simply as "spacers.") During assembly, the IC wafer 100 and the cap wafer 104a are brought together until the cap wafer contacts the spacers 1100. Optionally or alternatively, the IC wafer 100 can include spacers, as shown in phantom 212 in FIG. 2.

Figure 12:
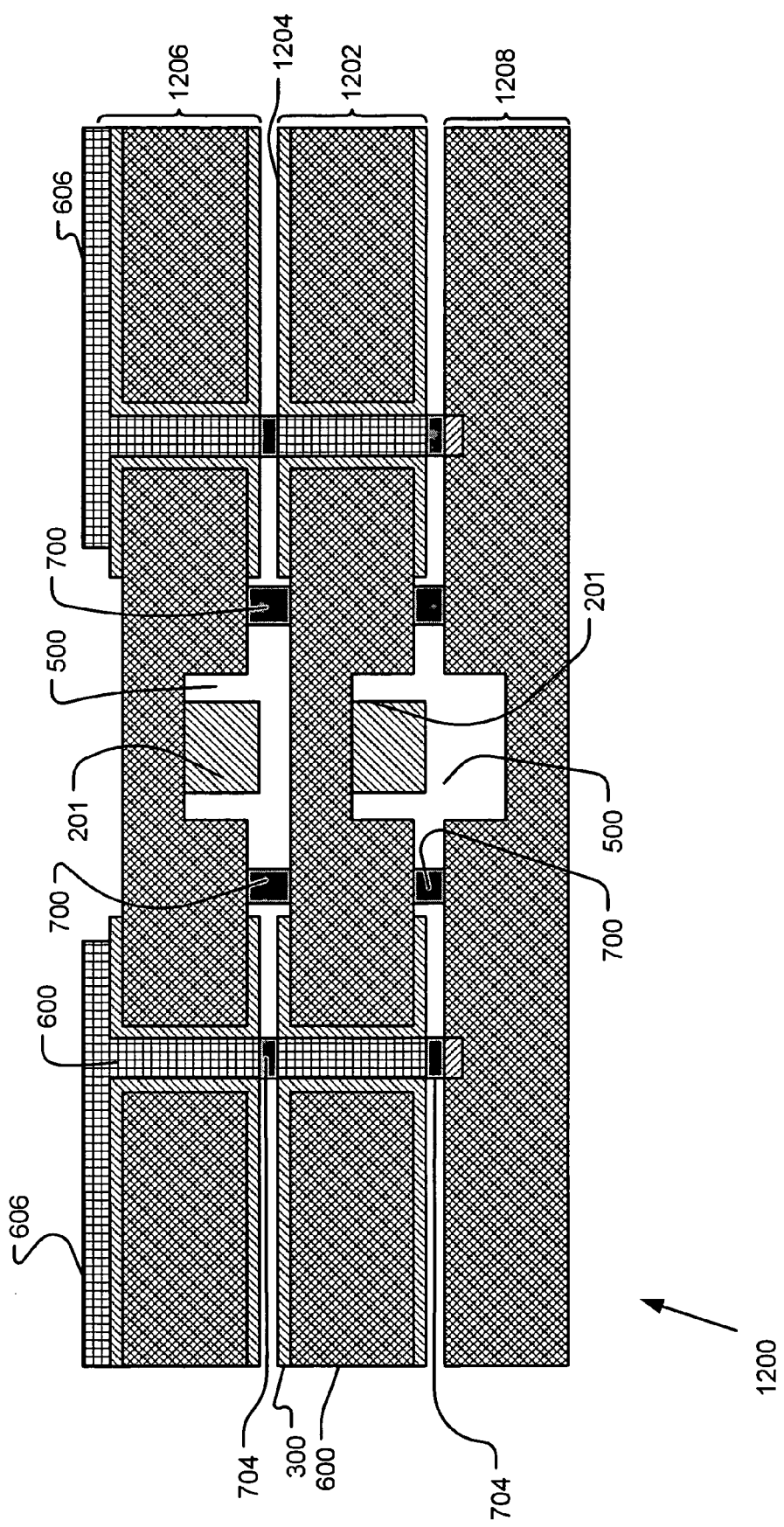
FIG. 12 is a cross-sectional diagram of a multi-story wafer-level packaged IC, in accordance with yet another embodiment of the present invention.

As noted, more than one cap wafer can be stacked on an IC wafer to make a "multi-story" IC 1200, as shown in FIG. 12. A middle layer 1202 is similar to the cap 906 shown in FIG. 9, except the middle layer need not include wafer contact pads on the insulating layer 300. Instead, the top of each electrically conductive material 600 forms a contact point on the front side 1204 of the middle layer 1202. A cap (top layer) 1206 is attached to the middle layer 1202, in the same manner as the cap 906 is attached to the base 904 in the embodiment shown in FIG. 9. As shown in FIG. 12, solder bumps or dots 704 and seal rings 700 can be used between the layers, as needed. Optionally, any of the layers 1202, 1206 or 1208 can include a cavity 500 to accommodate a die 201. The top layer 1206 includes wafer contact pads 606 for connection to a circuit board or the like. The electrically conductive paths formed by the electrically conductive material 600 can connect to one or more die, such as die 201, in any of the layers 1202, 1206 and 1208. Although the embodiment shown in FIG. 12 includes a total of three layers 1202, 1206 and 1208, other embodiments can include more or fewer layers.

Multi-story ICs can simplify the design of complex MEMS or other integrated circuit structures. For example, instead of implementing a complex three-dimensional IC design on a single wafer using a series a lithographic masks, one mask for each layer of the wafer, such a three-dimensional design can be decomposed into a series of relatively simple "stories" (wafers), and the stories can be bonded together as described above into a multi-story IC.

As described above, wafer-scale packaging typically involves bonding a cap wafer (or a portion thereof) to an IC wafer (or a portion thereof), such that several die are packaged in one operation. On the other hand, chip-scale packaging typically involves singulating die from an IC wafer, then bonding several of the singulated die to a common substrate, such as a single cap wafer (or a portion thereof) and finally cutting (singulating) the substrate to yield individual, chip-scale packaged ICs. Alternatively, each die is bonded to an individual, pre-cut cap.

Figure 13:
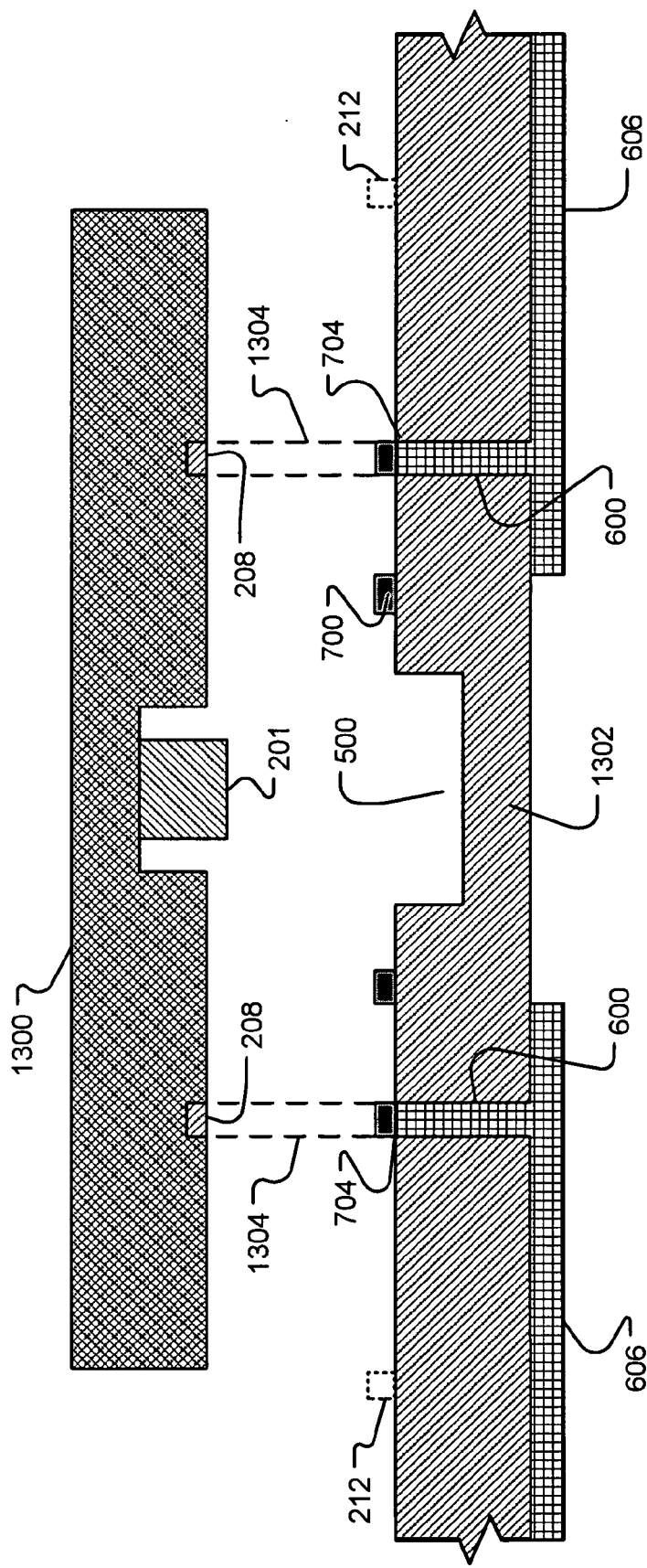
FIGS. 13-16 are cross-sectional diagrams of a chip-scale packaged IC at various intermediate states during fabrication, in accordance with one embodiment of the present invention.

One example of the first method (i.e., bonding several die to a single substrate, then cutting the substrate) is illustrated in FIGS. 13-16. FIG. 13 shows a portion 1300 of an IC wafer that has been singulated from an IC wafer. Such a portion 1300 of an IC wafer is referred to hereinafter as a "die chip." The die chip 1300 is to be bonded to a ceramic (or other material) cap wafer 1302. Some elements in FIGS. 13-16 are similar to corresponding elements in FIGS. 2-9, however the elements in FIGS. 13-16 are inverted, with respect to their orientations in FIGS. 2-9, and in FIGS. 13-16 the cap is below the die chip, whereas in FIGS. 2-9 the cap is above the IC wafer.

The die chip 1300 includes a die 201 and contact points 208, as described above with reference to FIGS. 2-9. The die 201 can include a sensor, micro-electromechanical (MEMS) or other structure. The cap wafer includes a cavity 500, a seal ring 700, bumps or dots of solder (or conductive epoxy or other appropriate material) 704 and other elements, as described above. Conventional "flip chip" production equipment and methods can be used to produce the die chip 1300 and to bond the die chip 1300 to the cap wafer 1302. The cap wafer 1302 can included layers (not shown) with conductive traces between the layers and/or plated through-holes or other conductive elements to interconnect elements within the cap and/or to elements in the die chip (once the die chip and the cap wafer are bonded).

The die chip 1300 is positioned on the cap wafer 1302 such that, when the die chip 1300 and the cap wafer 1302 are brought together, the contact points 208 contact through-hole interconnects 600, as indicated by dashed lines 1304. The through-hole interconnects electrically connect to contact pads 606, as discussed above. As noted above, the cap wafer 1302 can be fabricated of silicon or another semiconductor material and can include circuitry and/or a MEMS structure. If the cap wafer 1302 is fabricated of a conductor or semiconductor material, the through-hole interconnects are electrically insulated, as discussed above. However, if the cap wafer 1302 is fabricated of ceramic or another electrically insulating material, no separate insulating layer is needed between the cap wafer material and the through-hole interconnects 600 and the contact pads 606.

Alternatively, the seal ring 700 and/or the solder bumps/dots 704 can be formed on the IC wafer, rather than on the cap wafer.

Figure 14:
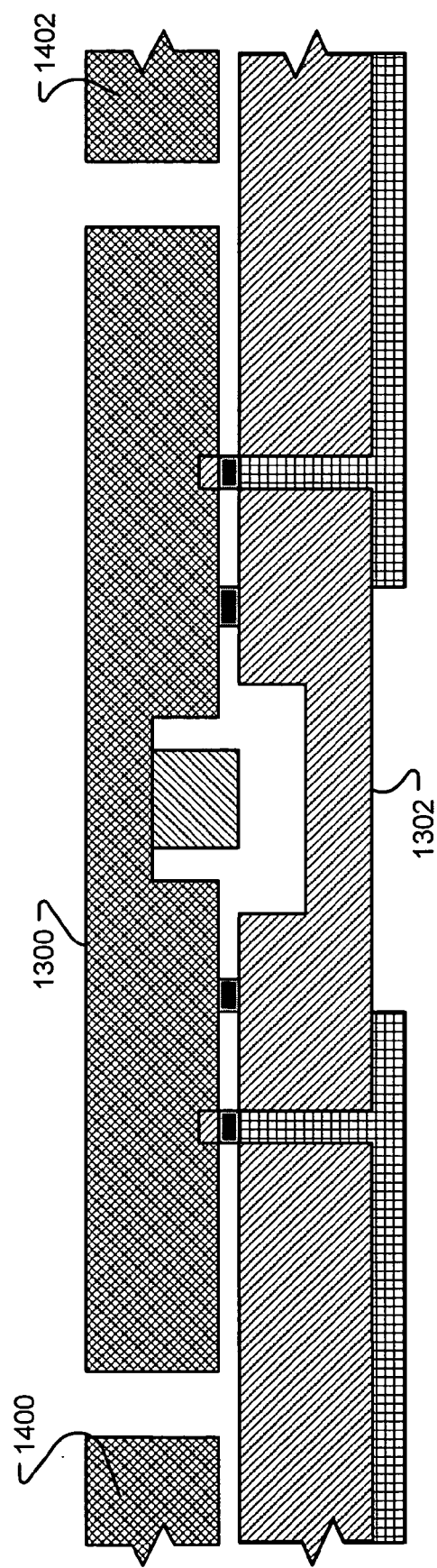

Conventional "pick and place" techniques and equipment can be used to position the die chip 1300 on the cap wafer 1302. Several die chips can be arranged on the cap wafer 1302 (such as in a 10×10 array), and the die chips 1300 are bonded to the cap wafer 1302, as described above. FIG. 14 shows the die chip 1300, as well as portions of adjacent die chips 1400 and 1402, bonded to the cap wafer 1302.

As discussed above, a spacer 212 (shown in phantom in FIG. 13) can be fabricated on the cap wafer 1302 to facilitate maintaining an appropriate space between the die chip 1300 and the cap wafer 1302 while the die chip and the cap wafer are bonded together. Alternatively, the spacer can be fabricated on the die chip (not shown) or on both the cap wafer and the die chip.

Figure 15:
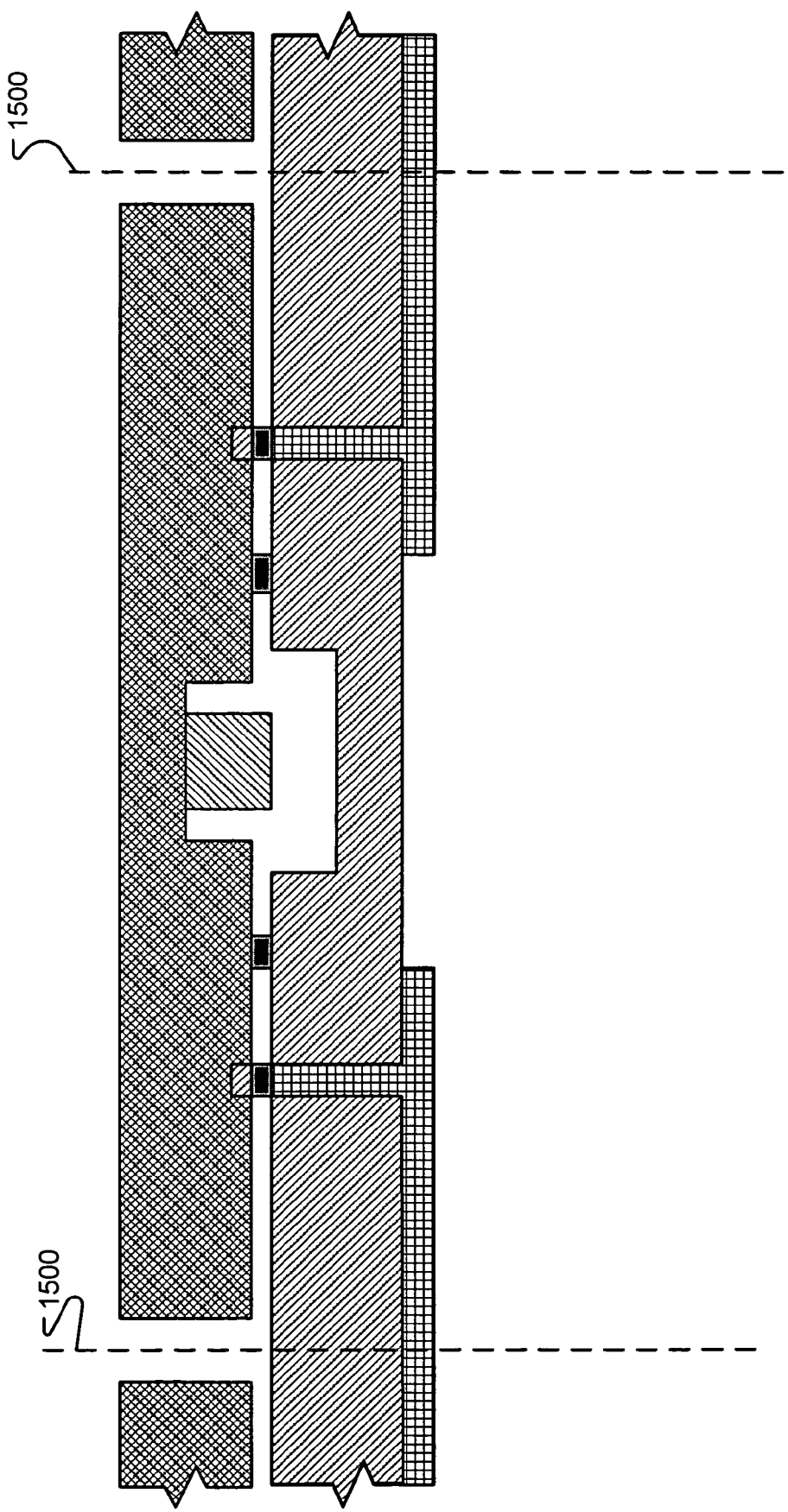
Figure 16:
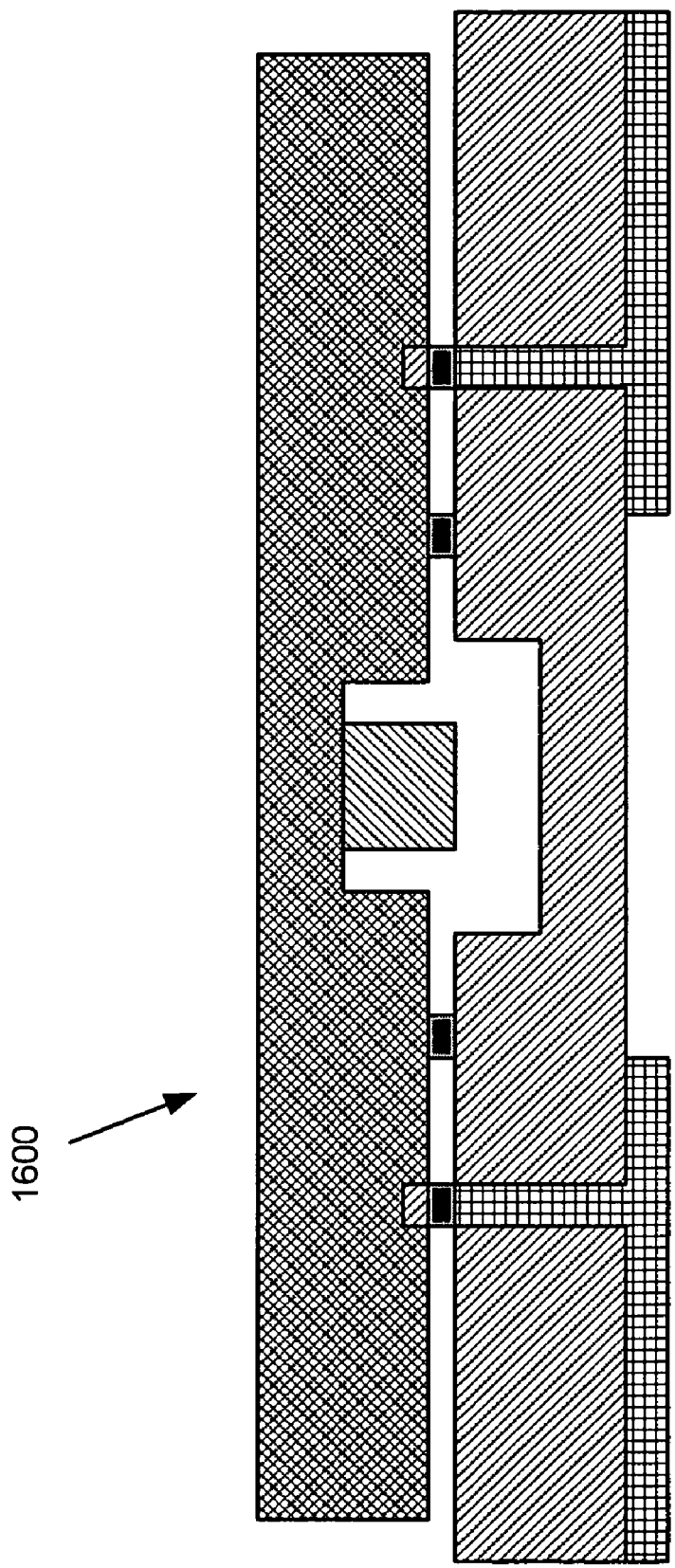

After the die chips 1300, 1400, 1402 are bonded to the cap wafer 1302, the cap wafer is cut or broken (collectively hereinafter "cut"), such as along dashed lines 1500, as shown in FIG. 15, to singulate the die chip-cap combinations ("chip-scale packaged ICs"). FIG. 16 shows an example of one such chip-scale packaged IC 1600. FIG. 10 shows another view of the chip-scale packaged IC at 900.

Figure 17:
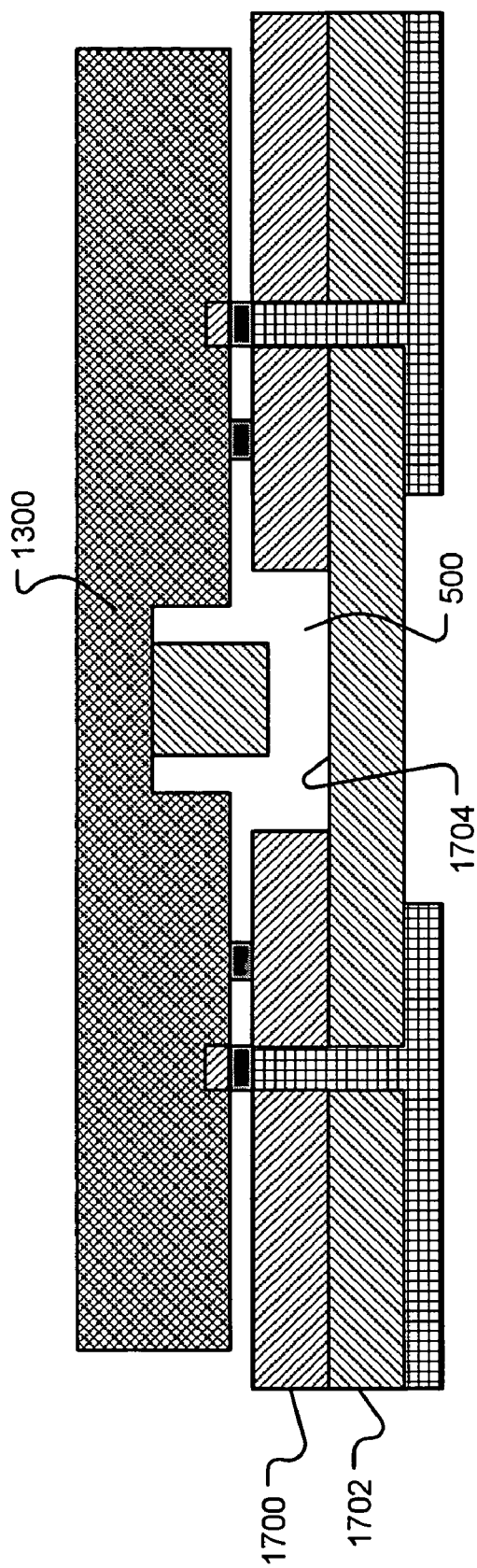
FIG. 17 is a cross-sectional diagrams of a chip-scale packaged IC in accordance with another embodiment of the present invention.

As shown in FIG. 13, the cap wafer 1302 and/or the die chip 1300 can be fabricated with a cavity 500 to accommodate a sensor, MEMS structure or other die. Alternatively, as shown in FIG. 17, two or more cap wafers 1700 and 1702 can be bonded together, such as by sintering, to form the cavity 500. In this case, one of the cap wafers 1700 includes a hole, which forms the cavity 500. The top surface 1704 of the other cap wafer 1702 forms the bottom of the cavity 500. However the cavity is formed, the seal 700 seals the sensor or other structure 201 in the cavity 500.

As discussed above, additional die chips and/or caps can be stacked to create a multi-story, chip-scale packaged IC. For example, after positioning the die chips 1300, 1400, 1402 (FIG. 14) on the cap wafer 1302, an additional die chip or cap (not shown) can be positioned on each die chip before or after the first die chips 1300, 1400 and 1402 are bonded to the cap wafer 1302, and the additional die chip or cap can be bonded to the die chip 1300. Thus, a "sandwich" comprising three layers (cap, die chip and cap) can be constructed. Alternatively, the sandwich can include multiple die chip layers, with or without ceramic or other material layers between each pair of die chips.

Figure 18:
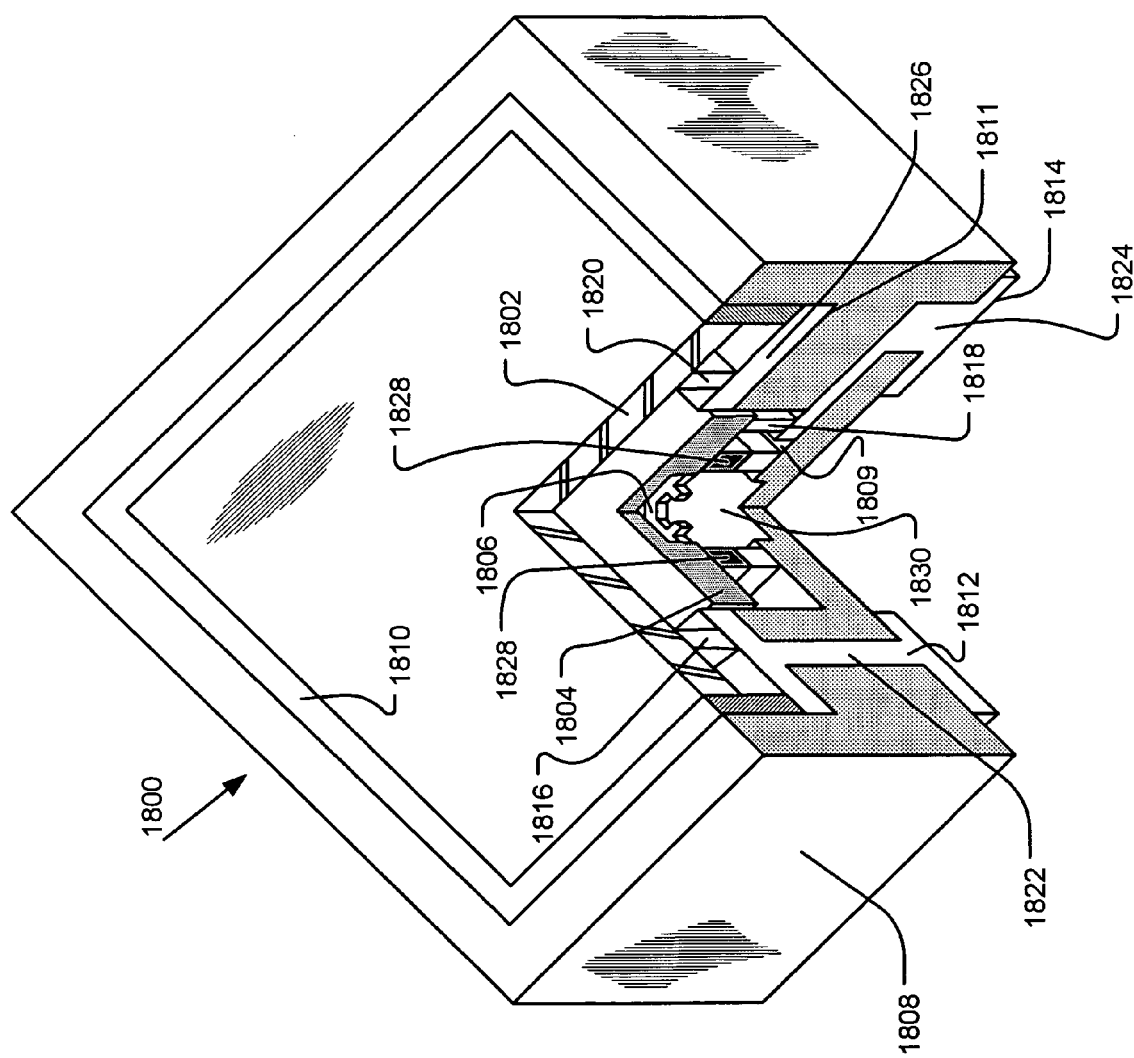
FIG. 18 is a cut-away view of a multi-story, chip-scale packaged IC in accordance with another embodiment of the present invention.

FIG. 18 shows a cut-away view of an exemplary multi-story, chip-scale packaged IC 1800. The IC 1800 includes two die chips 1802 and 1804. The second die chip 1804 includes a MEMS structure 1806, although either, both or none of the die chips 1802 and/or 1804 can include MEMS structures, sensors or other structures. The die chips 1802 and 1804 are disposed within a ceramic carrier or cap 1808. (In other embodiments, the carrier or cap 1808 is made of another material, such as silicon or plastic.) Sealing epoxy or another suitable substance 1810 seals the gap between the top die chip 1802 and the ceramic carrier 1808.

The carrier or cap 1808 includes mounting surfaces, such as surfaces 1809 and 1811, on which the die chips 1802 and 1804 can be mounted. Conductive material is selectively deposited on portions of these surfaces or other surfaces to form electrical contacts, as discussed above and below. Additional conductive material forms through-hole interconnects that extend from one surface of the carrier or cap 1808 to another surface thereof to electrically interconnect the die chips 1802 and 1804 to each other and/or to contact pads, as discussed below.

The die chip 1802 is larger than the die chip 1804. To accommodate the sizes of the die chips 1802 and 1804, the mounting surfaces 1809 and 1811 are stepped. The chip-scale packaged IC 1800 shown in FIG. 18 includes two die chips 1802 and 1804. However, other embodiments include additional mounting surfaces to accommodate additional die chips.

Figure 19:
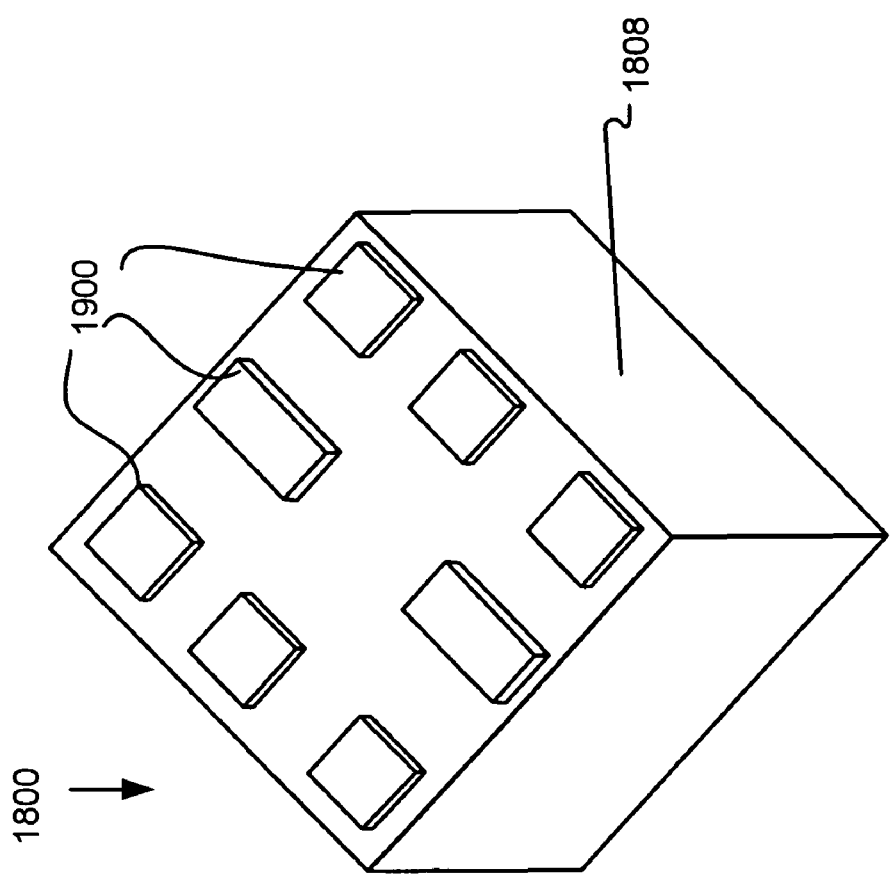
FIG. 19 is a perspective view of the bottom of the multi-story, chip-scale packaged IC of FIG. 18.

FIG. 19 is a perspective view of the bottom of the IC 1800. The IC 1800 includes one or more contact pads 1900, by which the IC 1800 can be mounted and electrically connected, such as by soldering, to a circuit board. In FIG. 18, two such contact pads are visible at 1812 and 1814. The die chips 1802 and 1804 include solder bumps or dots, such as solder bumps 1816, 1818 and 1820. The die chips 1802 and 1804 are electrically connected to the contact pads and/or to each other, as necessary. For example, the contact pad 1812 is electrically connected to the first die chip 1802 by a through-hole interconnect 1822 and the solder bump 1816. Similarly, the contact pad 1814 is electrically connected to the second die chip 1804 by a through-hole interconnect 1824 and the solder bump 1818.

The two die chips 1802 and 1804 can also be electrically interconnected without necessarily making the interconnection available outside the ceramic carrier 1808. Such interconnections are made by conductive strips, such as conductive strip 1826 and, when necessary, electrically conductive through-hole interconnects. The solder bump 1820 on the first die chip 1802 electrically connects the first die chip to the conductive strip 1826. Another solder bump (not visible) on the other die chip 1804 electrically connects the second die chip to the conductive strip 1826 or another conductive strip (not visible). The conductive strip 1826 can extend through the ceramic carrier 1808 as necessary, such as via one or more through-hole interconnects, to reach both solder bumps.

The MEMS structure 1806 is sealed by a seal ring 1828, as discussed above, within a cavity 1830. The MEMS structure 1806 is referred to as being "surrounded" or "encircled" by the seal ring 1828, although the seal ring need not be in the shape of a circle (as viewed from above or below the IC 1800) and the seal ring 1828 prevents infiltration of gases or particles from the sides. The carrier 1808 and the rest of remainder of the die chip 1804 prevent infiltration from above or below. The second die chip 1802 can be bonded to the carrier 1808 before or after the carrier 1808 is singulated from a cap wafer.

Although a chip-scale packed IC has been described with reference to a ceramic cap, other materials are acceptable, including semiconductor and plastic materials. Ceramic and some other materials yield hermetically sealed IC packages.

Figure 20:
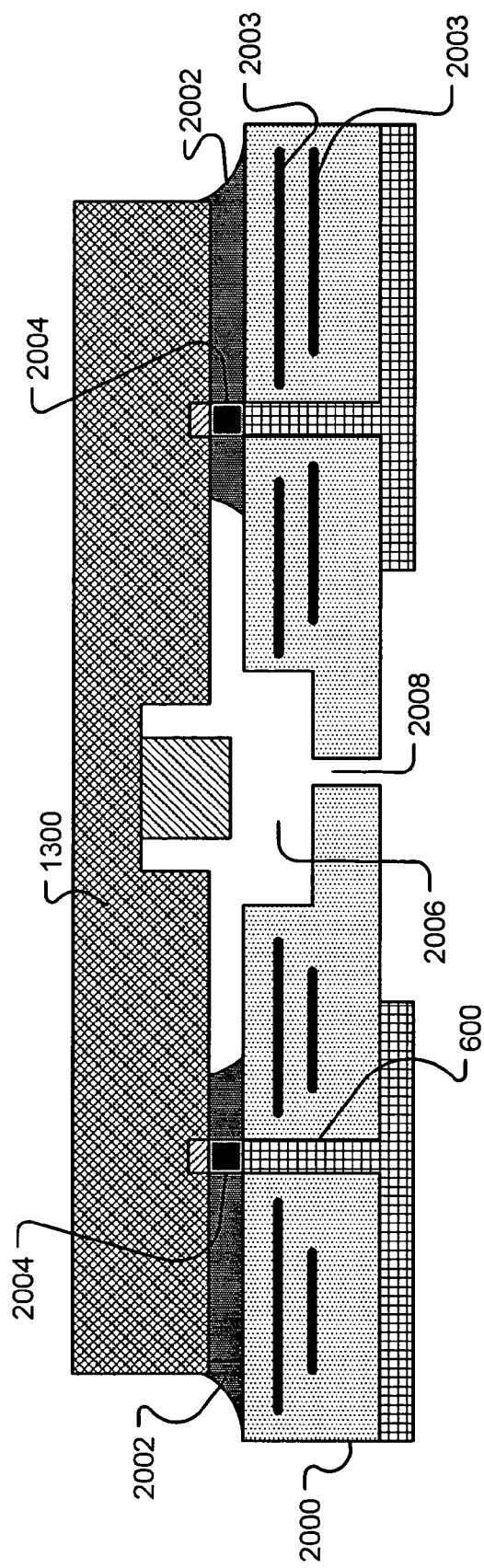
FIG. 20 is a cross-sectional diagrams of a chip-scale packaged IC in accordance with yet another embodiment of the present invention.

Other materials, such as some plastics, yield non-hermetically sealed IC packages, however non-hermetic IC packages are typically less expensive than hermetic ceramic packages. Such less expensive IC packages are adequate for some non-critical applications, such as video games. FIG. 20 shows an example of one such chip-scale packaged IC. A die chip 1300 is bonded to a plastic (or other material) cap 2000 by epoxy 2002 or other suitable adhesive. (The cap 2000 is also referred to as a "substrate.") The cap can be a plastic circuit board (PCB) or other chip carrier. The substrate can, but need not, include multiple layers 2003 of interconnected circuitry.

Electrical connections between the die chip and through-hole interconnects 600 can be made by a conductive adhesive 2004 or another suitable material. The cap 2000 can include a cavity 2006, if required. The cavity 2006 can be drilled or formed by another suitable method before the die chip 1300 and the cap 2000 are bonded together. Optionally, the cap 2000 includes a hole 2008 to vent out-gasses produced by the epoxy 2002 while the epoxy cures. After the epoxy 2002 cures, the hole 2008 can be sealed, if desired.

While the invention is described through the above-described exemplary embodiments, it will be understood by those of ordinary skill in the art that modifications to, and variations of, the illustrated embodiments may be made without departing from the inventive concepts disclosed herein. For example, although the seal ring 700 and the solder bumps or dots 704 are described as initially attached to the cap wafer 104, the seal ring and/or the solder bumps or dots can, alternatively or optionally, be initially attached to the IC wafer 100. In another example, the cap wafer for a chip-scale packaged IC is made of silicon or another semiconductor material. Accordingly, the invention should not be viewed as limited, except by the scope and spirit of the appended claims.

What is claimed is:

1. A method of chip-level packaging an integrated circuit (IC) die, comprising:
    providing a plurality of singulated die chips, each comprising a die and at least one electrical contact point associated with the die;
    providing a cap wafer;
    forming electrically conductive paths through the cap wafer at positions corresponding to respective ones of the electrical contact points on respective ones of the plurality of singulated die chips, such that at least one of the electrically conductive paths extends from a first surface of the cap wafer to a second surface of the cap wafer;
    before cutting the cap wafer, bonding each of the plurality of singulated die chips to the cap wafer, such that the ends of the conductive paths on the first surface of the cap wafer are electrically connected to the respective electrical contact points on the respective plurality of singulated die chips; and cutting the cap wafer between pairs of the singulated die chips,
    wherein forming each electrically conductive path comprises:
    drilling a hole through the cap wafer; and
    filling the hole with an electrically conductive material by:
        pressing a mixture of powdered metal alloy paste containing an organic solvent into the hole; and
        subsequently burning away the organic solvent and leaving a hardened metal alloy.

2. A method of chip-level packaging an integrated circuit (IC) die, comprising:
    providing a plurality of singulated die chips, each comprising a die and at least one electrical contact point associated with the die;
    providing a cap wafer;
    forming electrically conductive paths through the cap wafer at positions corresponding to respective ones of the electrical contact points on respective ones of the plurality of singulated die chips, such that at least one of the electrically conductive paths extends from a first surface of the cap wafer to a second surface of the cap wafer;
    forming an electrically conductive package contact pad on at least a portion of the second surface of the cap wafer and in contact with one end of one of the electrically conductive paths;
    before cutting the cap wafer, bonding each of the plurality of singulated die chips to the cap wafer, such that the ends of the conductive paths on the first surface of the cap wafer are electrically connected to the respective electrical contact points on the respective plurality of singulated die chips; and
    cutting the cap wafer between pairs of the singulated die chips.

3. The method of claim 2, wherein providing the cap wafer comprises forming at least one spacer on the first surface of the cap wafer.

4. The method of claim 2, wherein providing the cap wafer comprises providing a cap wafer made of silicon.

5. The method of claim 2, wherein providing the cap wafer comprises providing a cap wafer made of a non-silicon material.

6. The method of claim 2, wherein providing the cap wafer comprises providing a cap wafer made of ceramic.

7. The method of claim 2, wherein providing the cap wafer comprises providing a cap wafer made of plastic.

8. The method of claim 2, wherein providing the plurality of singulated die chips comprises forming at least one spacer on each of the plurality of singulated die chips.

9. The method of claim 2, wherein forming each electrically conductive path comprises:
    drilling a hole through the cap wafer; and
    filling the hole with an electrically conductive material.

10. The method of claim 9, wherein filling each hole comprises filling the hole with metal.

11. The method of claim 9, wherein filling each hole comprises electroplating the hole with metal.

12. The method of claim 9, wherein filling each hole comprises filling the hole with solder.

13. The method of claim 9, wherein filling each hole comprises filling the hole with AuSn.

14. The method of claim 9, wherein drilling the hole through the cap wafer comprises etching the hole.

15. The method of claim 9, wherein drilling the hole through the cap wafer comprises laser drilling the hole.

16. A method of chip-level packaging an integrated circuit (IC) die, comprising:
    providing a plurality of singulated die chips, each comprising a die and at least one electrical contact point associated with the die;
    providing a cap wafer made of a multi-layered plastic circuit board;
    forming electrically conductive paths through the cap wafer at positions corresponding to respective ones of the electrical contact points on respective ones of the plurality of singulated die chips, such that at least one of the electrically conductive paths extends from a first surface of the cap wafer to a second surface of the cap wafer;

before cutting the cap wafer, bonding each of the plurality of singulated die chips to the cap wafer, such that the ends of the conductive paths on the first surface of the cap wafer are electrically connected to the respective electrical contact points on the respective plurality of singulated die chips; and cutting the cap wafer between pairs of the singulated die chips.

17. The method of claim 2, wherein forming each electrically conductive path comprises:

drilling a hole through the cap wafer;

forming an insulating layer on the inside wall of the drilled hole, thereby defining an insulated passage through the cap wafer; and filling the insulated passage with an electrically conductive material.

18. The method of claim 17, wherein forming the insulating layer on the inside wall of the drilled hole comprises thermally growing the insulating layer.

19. The method of claim 17, wherein forming the insulating layer on the inside wall of the drilled hole comprises thermally growing a layer of $SiO_2$ or SiN.

20. The method of claim 17, wherein forming the insulating layer on the inside wall of the drilled hole comprises vapor depositing the insulating layer.

21. The method of claim 17, wherein filling each insulated passage comprises:

pressing a mixture of powdered metal alloy paste containing an organic solvent into the insulated passage; and subsequently burning away the organic solvent and leaving a hardened metal alloy.

22. The method of claim 17, wherein filling each insulated passage comprises filling the insulated passage with metal.

23. The method of claim 17, wherein filling each insulated passage comprises electroplating the insulated passage with metal.

24. The method of claim 17, wherein filling each insulated passage comprises filling the insulated passage with solder.

25. The method of claim 17, wherein filling each insulated passage comprises filling the insulated passage with AuSn.

26. The method of claim 17, wherein forming each insulated electrically conductive path further comprises:

forming an insulating layer on at least a portion of the second surface of the cap wafer adjacent the drilled hole; and forming an electrically conductive package contact pad on at least a portion of the insulating layer and in contact with one end of the electrically conductive material in the insulated passage.

27. The method of claim 17, wherein drilling the hole through the cap wafer comprises etching the hole.

28. The method of claim 17, wherein drilling the hole through the cap wafer comprises laser drilling the hole.

29. The method of claim 2, wherein providing the cap wafer comprises forming at least one cavity in the first side of the cap wafer.

30. The method of claim 29, further comprising disposing a sensor within the cavity.

31. The method of claim 29, wherein bonding the cap wafer comprises sealing the cavity against infiltration through a gap between the singulated die chip and the cap wafer.

32. The method of claim 31, wherein sealing each of the plurality of die chips comprises forming a glass frit on the cap wafer.

33. The method of claim 31, wherein sealing each of the plurality of die chips comprises forming a glass frit on each of the plurality of die chips.

34. The method of claim 31, wherein sealing each of the plurality of die chips comprises forming a metal seal on the cap wafer.

35. The method of claim 31, wherein sealing each of the plurality of die chips comprises forming a metal seal on each of the plurality of die chips.

36. The method of claim 2, further comprising thinning the cap wafer.

37. The method of claim 36, wherein thinning the cap wafer comprises lapping the cap wafer.

38. The method of claim 2, further comprising:

providing a second plurality of singulated die chips, each comprising a die and at least one electrical contact point associated with the die;

forming second electrically conductive paths through the cap wafer at positions corresponding to respective ones of the electrical contact points on respective ones of the second plurality of singulated die chips, such that at least one of the second electrically conductive paths extends from a third surface of the cap wafer to second surface of the cap wafer; and bonding each of the second plurality of singulated die chips to the cap wafer, such that the ends of the second conductive paths on the third surface of the cap wafer are electrically connected to the respective electrical contact points on the respective second plurality of singulated die chips.

39. The method of claim 38, wherein bonding each of the second plurality of singulated die chips comprises bonding each of the second plurality of singulated die chips before cutting the cap wafer.

40. The method of claim 38, wherein bonding each of the second plurality of singulated die chips comprises bonding each of the second plurality of singulated die chips after cutting the cap wafer.

41. The method of claim 38, further comprising forming an electrically conductive package contact pad on at least a portion of the second surface of the cap wafer and in contact with one end of one of the electrically conductive paths.

42. The method of claim 38, wherein providing the cap wafer comprises forming at least one spacer on the first surface of the cap wafer.

43. The method of claim 38, wherein providing the cap wafer comprises forming at least one cavity in the first side of the cap wafer.

44. The method of claim 38, wherein bonding the cap wafer comprises sealing each of the plurality of singulated die chips against infiltration through a gap between the singulated die chip and the cap wafer.

45. The method of claim 44, wherein sealing each of the plurality of die chips comprises forming a glass frit.

46. The method of claim 44, wherein sealing each of the plurality of die chips comprises forming a metal seal.

* * * * *